United States Patent [19]

Berkowitz

[11] 4,449,051
[45] May 15, 1984

[54] DOSE COMPENSATION BY DIFFERENTIAL PATTERN SCANNING

[75] Inventor: Edward H. Berkowitz, Palo Alto, Calif.

[73] Assignee: Varian Associates, Inc., Palo Alto, Calif.

[21] Appl. No.: 349,293

[22] Filed: Feb. 16, 1982

[51] Int. Cl.³ .............................................. G01N 23/00
[52] U.S. Cl. ................................................. 250/492.2
[58] Field of Search ............................. 250/452.2, 398; 219/121 EU, 121 EJ, 121 EK; 313/361

[56] References Cited

U.S. PATENT DOCUMENTS

| | | | |
|---|---|---|---|
| 3,956,635 | 5/1976 | Chang | 250/492.2 |
| 4,234,358 | 11/1980 | Celles | 250/492.2 |
| 4,260,893 | 4/1981 | Bakker et al. | 250/492.2 |
| 4,260,897 | 4/1981 | Bakker et al. | 250/492.2 |
| 4,283,631 | 8/1981 | Turner | 250/492.2 |

OTHER PUBLICATIONS

"Automatic Electron Beam Publication of Micro-Size Devices", Wilson et al., *Scanning Electron Microscopy*, Apr. 1976, pp. 659–668.

*Primary Examiner*—Bruce C. Anderson
*Attorney, Agent, or Firm*—Stanley Z. Cole; Edward H. Berkowitz

[57] ABSTRACT

Precise control of radiation dose distribution over the surface of a workpiece is obtained by differential scanning in accord with a density of scanning traces function. This may be accomplished by differential repetition of the trace in the incremented area dA at generalized coordinates (p,q) of the surface, by frequency modulation of the waveform(s) controlling the scan, by spatial modulation of the scan through choice of scan pattern, or by combinations of these approaches.

12 Claims, 11 Drawing Figures

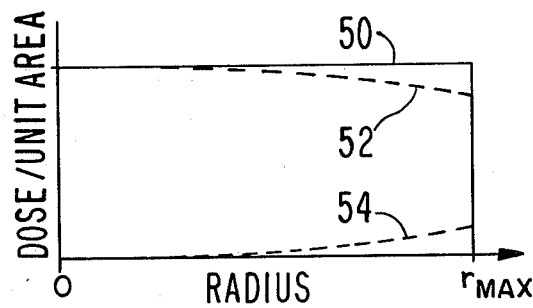
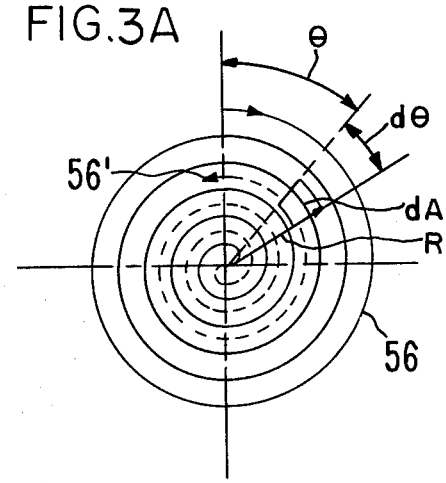
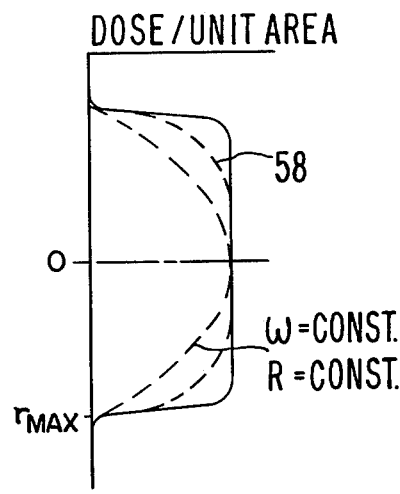
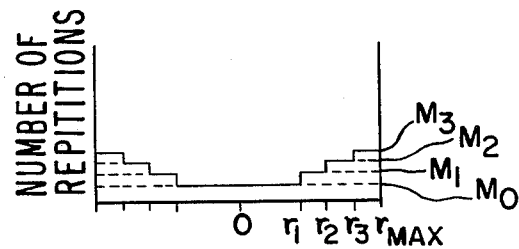

DOSE COMPENSATION BY DIFFERENTIAL PATTERN SCANNING

DESCRIPTION

1. Field of the Invention

The present invention relates to control of scanned beams of charged particles for incidence upon a work piece, and more particularly relates to improvements in the control of an integrated dose distribution of a charged particle beam on said workpiece.

2. Background of the Invention

Charged particle irradiation of materials has been used to modify material properties, especially by ion implantation of semiconductors, and to alter the properties of metals. In these processes there is a requirement for controlling the irradiation intensity, instantaneous and/or cumulative. An important requirement of commercial semiconductor fabrication processes has been the uniformity of the product. Where a semiconductor wafer is irradiated with an ion beam to achieve a desired dopant or impurity concentration, the uniformity of dopant concentration is a primary performance specification for the apparatus. In systems wherein an ion beam is scanned at constant transverse velocity across a planar semiconductor wafer, it is known that the resulting areal dose concentration, instantaneous or integrated, will decrease slightly as the trace departs from the undeflected or central portion of the scan due to simple geometric effects. One such effect is the variation in the solid angle as a function of the variation in angle of incidence of the beam as it is scanned across the wafer from a fixed center of deflection located within or proximate the deflection system. The magnitude of the effect depends upon the orientation of the wafer or other workpiece to the undeflected beam and such geometrical factors as the workpiece dimensions, distance to deflection system, and like parameters. Ordinarily the plane of the wafer is inclined with respect to the undeviated beam direction by an angle of the order of six to eight degrees from the normal in order to avoid crystal channeling effects. In one commercial implanter processing a four-inch diameter wafer, the solid angle variation causes of the order of one and one-half percent in variation in dose between the periphery of the wafer and the central region thereof. The effect is, of course, present wherever a scanning trace is generated by deflecting a beam about some axis spaced apart from the plane of the wafer and where the deflection is carried out so as to produce a constant scan rate over the surface of the wafer. This particular effect would vanish in the imaginary case of irradiation of a concave spherical shell of radius equal to and centered at a fixed radius of curvature of the deflection system where, in analogy to U.S. Pat. No. 4,282,924, the workpiece is deformed to a convex surface with respect to the radiation source the effect is exacerbated. The effect, as above described, contributes to what will be termed trace inhomogeneity.

Another source of trace inhomogeneity results whenever the center of deflection for the deflection system is not fixed, but instead varies with the deflection angle. This is in fact the case for simple electrostatic and magnetic deflection systems. Contributions to trace inhomogeneity from this source are usually small compared to the gross solid angle variation.

In one prior art approach to the improvement of dose uniformity, the trace inhomogeneity is compensated by applying to the deflection system a waveform deliberately nonlinear to obtain a trace distribution $\partial p/\partial s$ which varies over the trace path s to compensate a known aberration. It is further known in the prior art to tolerate a degreee of noise on the output deflection system in order to dither the beam in a slightly random fashion about its equilibrium trace path. These methods have been described in U.S. Pat. No. 4,283,631.

It is well known in the prior art to perform a scan in two dimensions by corresponding frequencies which are sufficiently anharmonic to avoid nonuniformities in the two-dimensional dose arising from Lissajous figures.

BRIEF DESCRIPTION OF THE INVENTION

The object of the present invention is to secure a desired integrated dose distribution on the surface of a workpiece subject to charged particle irradiation.

In one feature of this system, a charged particle deflection apparatus causes the trace of the beam intercepted on the workpiece to execute a desired pattern over the surface of the workpiece wherein the displacement of adjacent segments of said trace are so distributed that the surface of the workpiece exhibits an areal density proportional to the desired distribution.

In yet another feature of the invention local regions of the workpiece surface receive a plurality of traces superimposed to yield the desired local integrated areal dose density.

In another feature of the invention, the integrated areal dose accumulated per unit length along any scan trajectory is controlled to conform to a desired function of coodinates on the surface of the workpiece.

In another alternate feature of the invention, the dose accumulated per unit length along any scan trajectory is permitted to vary according to the geometrical or time dependences which may be inherent in the deflection system and the net departure from the desired integrated dose distribution is compensated by the local integrated number density of traces per unit area characteristic of said desired pattern.

In still another feature of the invention the form of said desired pattern and as well the dose accumulation per unit length along the scan trajectory are selected together to achieve any desired cumulative dose distribution.

The desired trace pattern on the workpiece surface in any local region is characterized by a first plurality of trace segments exhibiting a characteristic spacing. Additional trace segments of finite width h may be contiguous on the peripheries thereof and further additional trace segments may be overlapped or superimposed thereon. The scanning system is so controlled as to vary the spacing between adjacent trace segments from an interval $l=h$, the width of the trace intercepted on the surface, to $l=0$, the superposition condition. The number of trace trajectories in an element of area dA at generalized coordinate (p,q) on the surface of this workpiece is controlled by a processor which directs the scan to produce the desired distribution.

BRIEF DESCRIPTION OF THE FIGURES

FIG. 2 shows an example of uncorrected and desired dose distributions and a correction function.

FIGS. 3A, B and C show a spiral scan pattern, projected radial dose density distribution and radial repetition function.

DETAILED DESCRIPTION OF THE INVENTION

Figure 1:
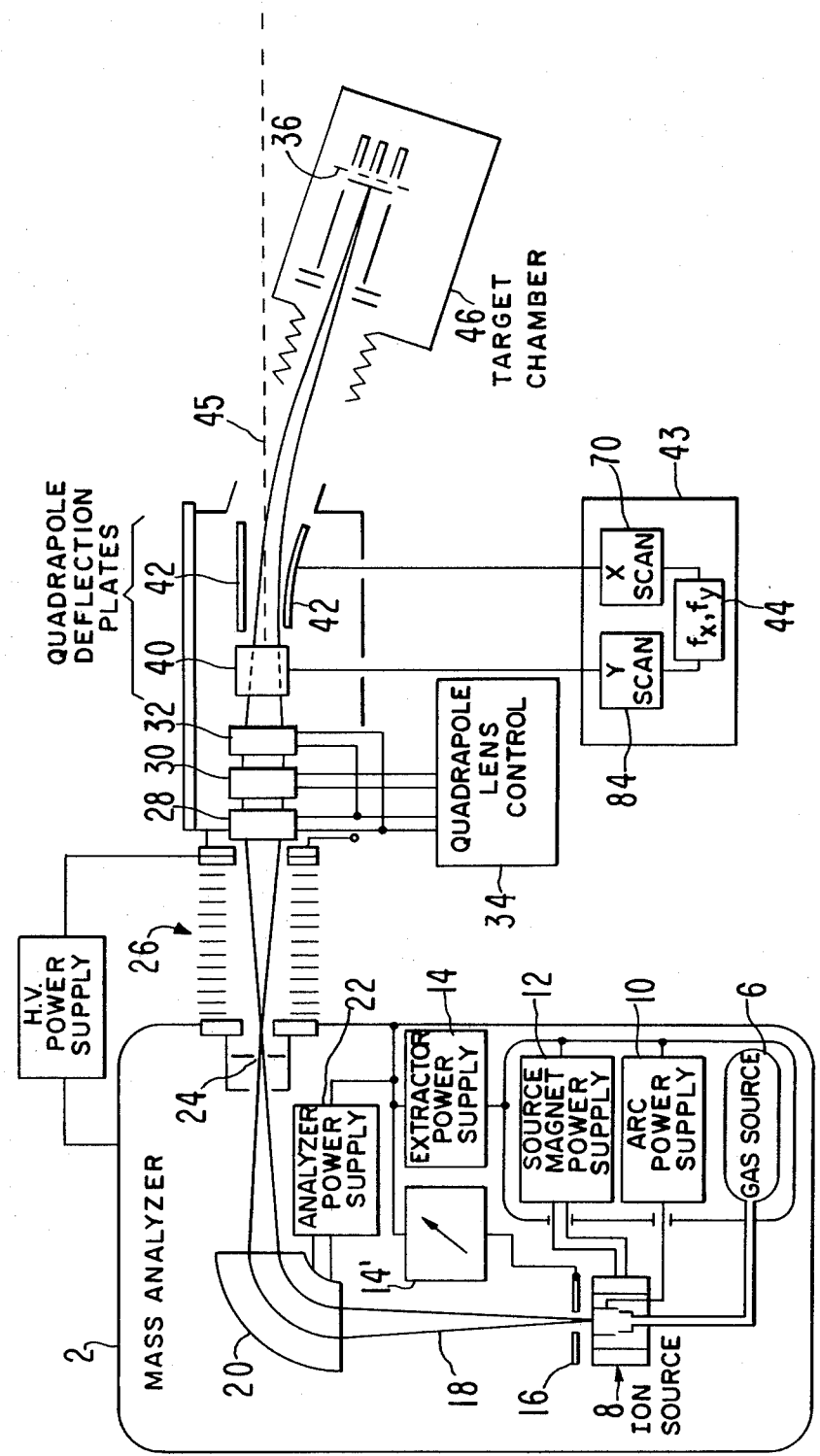
FIG. 1 is a schematic block diagram of a typical ion implantation system incorporating the present invention.

The present invention is most easily described in the functional context of an ion implantation system typical of available commercial equipment as shown in FIG. 1. A high voltage terminal 2 is held at high potential relative to ground by high voltage power supply 4. Terminal 2 contains ion source apparatus required to form a beam of ions of a desired species. In common practice an ion source 8 is provided to ionize a gas derived from gas handling system 6 or to vaporize a solid material. A typical ion source will require a power supply 10 to sustain an ionizing discharge, power supply 12 to impose an axial magnetic field across the discharge region, and extraction supply 14 with vernier 14' to cooperate with extraction electrode 16 to shape the electric field at the aperture of the source to achieve effective extraction of a well defined high current ion beam from the environs of the ion source. A more detailed description of ion source techniques is outside the scope of this work. See, for example, L. Valyi, "Atom and Ion Sources", Wiley-Interscience, 1978. The beam 18 diverging from the ion source 8 is momentum-analyzed in analyzer magnet 20, the latter energized from analyzer power supply 22. Analyzed beam passes through analyzer exit slit 24 and thence to accelerator tube 26 where it encounters a carefully designed field gradient from the high voltage terminal through tube 26 to ground potential. Optical elements such as a quadrupole triplet 28, 30, 32 and associated control system 34 operate to produce a spatial-energy focus at a desired image plane. Two sets of electrostatic deflection plates, 40 and 42, arbitrarily labeled y and x respectively serve to direct the beam over the desired area of the image plane. The waveform applied to the respective deflection plates and their synchronization to form the appropriate scanning program is accomplished by scanning system 43. The control of the scanning program by processor 44 is an important aspect of the invention discussed below. The quiescent beam is deflected sufficiently to completely separate neutral beam 45 (arising from charge exchange collisions with residual gases) from the charged beam. Target chamber 46 contains beam defining apertures, beam monitoring and integrating apparatus and equipment for introducing the wafer or workpiece into the vacuum system and aligning same with respect to the target plane.

Vacuum pumping apparatus and the vacuum envelope of the system are not indicated, but it will be appreciated that the entire region traversed by the beam is maintained at high vacuum.

In the context of basic semiconductor fabrication, it is extremely important that a high degree of uniformity of ion dosage be maintained over the surface of a wafer presented for doping and that the time required for such processing be minimal. Doping via ion implantation is accomplished by scanning an ion beam over the surface of the work-piece as discussed above. The scan conventionally results in a generally parallel set of scan traced segments defining a rectangular scan window. Another choice of scan geometry is a set of approximately concentric arcuate traces most conveniently realized as a spiral trace. Beneficial aspects of the present invention are equally applicable to any scan geometry, but a brief digression is useful to elucidate the contribution of the invention.

In semiconductor processing, the workpiece ordinarily takes the form of a thin circular disc of semiconductor material on which a number of complete chips will eventually be fabricated. The criteria of uniformity has importance as much for the uniform electrical properties of the circuits and devices on a given chip as well as the interchangeable uniform properties of all like chips. Accordingly, one scan strategy of the prior art has been to employ the most linear portion of a scan trace to intercept the target, while the remaining portion of the trace occurs off-target with consequent duty cycle in beam current and processing time. For a model linear waveform driven scan, a maximum duty cycle of approximately $\pi/4$ occurs for a wafer of radius R circumscribed in a square of edge 2R. Some benefit is derived from utilizing the off-wafer scan portion for direct monitoring of beam intensity in Faraday cups located at the periphery of the workpiece. In contrast, an arcuate scan of approximately circular traces incident on a circular cross-sectional workpiece increases the duty cycle to approach 100%, but the direct sampling of the direct beam at numerous intermittent points in the scan via Faraday cups at the periphery of the workpiece is no longer feasible.

For a circular wafer of radius $r_0$, the desired uniform distribution 50 is illustrated in FIG. 2. A somewhat fanciful and exaggerated uncorrected distribution 52 resulting from a linear waveform scan on a planar surface indicated together with a correction function 54 which upon addition to distribution 52 yields the desired distribution 50. In this instance, the distribution 52 results from the solid angle variation over the amplitude of the scan due to the deflection angle of the beam and an assumed linear waveform driving the trace.

For the present expository purposes, discussion is first directed to the uniform irradiation of a planar workpiece exhibiting circular symmetry. This is the usual situation of interest in semiconductor processing.

One embodiment of the method is described with the aid of FIGS. 3A and B wherein the deflection system including processor 44 causes the charged particle beam to execute an Archimedes' spiral ($r=k\theta$) scan 56 of the target. For simplicity, the beam spot is assumed to be of circular cross-section although other cross-sections and beam current distributions will readily occur to those skilled in the art. A scan is accomplished in the conventional orthogonal deflection system where the x and y deflections execute $$x = \alpha X_0(t) \cos \omega t$$

$$y = \beta Y_0(t) \sin \omega t$$

The explicitly stated coefficients $\alpha$ and $\beta$ are adjusted for the situation where the plane of the workpiece is inclined at an angle to (undeflected) beam incidence. In such situation, the projection of the usual circular workpiece presents an elliptical aspect to the beam and the coefficients $\alpha$ and $\beta$ are chosen to accommodate this geometry. For the purposes of the discussion these geometric factors will be absorbed into the respective modulae, e.g., $$X(t) = \alpha X_0(t)$$

$$Y(t) = \beta Y_0(t)$$

The modulus $R(t) = X(t)^2 + Y(t)^2$ is varied by processor 44 in such a fashion as to produce a spiral trace for which the trace segments in a given angular interval are, at first approximation, radially equidistant from adjacent trace segments (R=const). The modulus function R(t) is adapted to meet this constraint for the purposes of this discussion. In unit time dt a number of beam particles dQ are deposited in unit length of trace, ds. For the spiral scan of FIG. 3, $ds = r d\theta$ and in an annular region at radius r of width dr the differential dose is given by $$\frac{dQ}{dr} = 2\pi \frac{dQ}{dt} \frac{dt}{d\theta} \frac{1}{r}$$

with the result that the particle flux j is $$\frac{dQ}{dr} = \frac{2\pi j}{\omega r}$$

where j is the particle flux and $\omega$ is the angular frequency. For stable operation of the accelerator, it is desirable to maintain a constant beam current. It is therefore necessary (where uniform dose is the desired criteria) to either modulate the angular frequency $\omega$ appropriately, or alternatively to perform m (r) rescans of the workpiece (or portion thereof) where m (r) varies in proportion to r. It will be assumed for discussion purposes that the frequency $\omega$ is modulated to assure that $\omega(t)$ varies with r(t) to sustain dose density per unit area independent of radius.

In the present example it is desired to achieve uniform spacing of traces for a zeroth order dose. For each trace, of width h spaced $\Delta r$ on centers, the pattern is re-executed a number of times $n_0 = \Delta r/h$ varying the initial conditions to accomplish a continuous nominal dose distribution $\rho_0$ (r, $\theta$). This zero order distribution has no significant compensatory effect. FIG. 3B indicates, schemetically, a single such continuous scan. At the conclusion of the scan, processor 44 then adjusts scan parameters to displace the next trace by a desired amount. An optional retrace path is indicated by dotted line 56'.

In order that the distribution be corrected, partial repetitions are next initiated over pertinent regions. For example, in accord with the projected radial distribution of FIG. 3B, $N_1$ repetitions are performed over the interval $r_{max} < r < r_1$ to accomplish the requisite dose increment $N_0 + N_1$ in the annular region from $r_1$ to $r_2$ as shown in FIG. 3C. These $N_1$ traces are controlled as for the $N_0$ traces to obtain nominally continuous coverage in the interval from $r_{max}$ to $r_1$. At the conclusion of this set of $N_1$ scans, the annular region from $r_1$ to $r_2$ is correct and each of the remaining regions of greater radius have been partially corrected to yield the partially corrected dose curve 58 of FIG. 3B. (Note that FIG. 3C shows the number of repetitions while FIG. 3B is the resulting dose.) For the adjacent region, $r_2$ to $r_3$, a number of incremented repetitions ($N_3-N_2$) will bring the region $r_2$ to $r_3$ to its corrected magnitude while again reducing the error in the remaining annular regions. The dose is thus intensified in selected regions to produce a desired distribution by tailored integration under control of processor 44. This example assumes that an uncorrected dose results in a distribution which is a monotonically decreasing function of radius. The invention is clearly not limited in this regard, and the example is merely for the illustrative purposes.

Figure 4A:
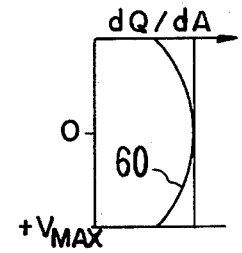
FIGS. 4A, B and C illustrate another spiral scan pattern projected dose density distribution and spatial frequency function h(r).
Figure 4B:
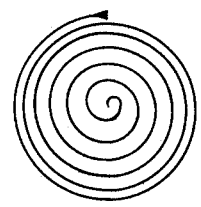
Figure 4C:
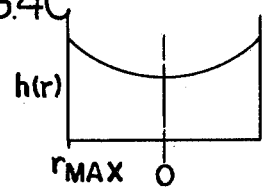
Figure 5C:
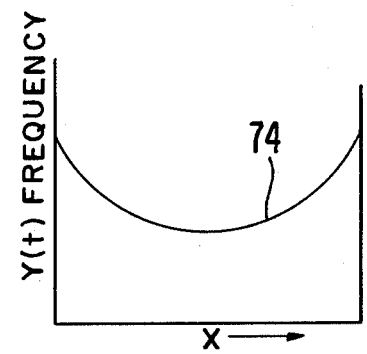
FIGS. 5A, B and C show a schematic example of the invention for a raster san.
Figure 5A:
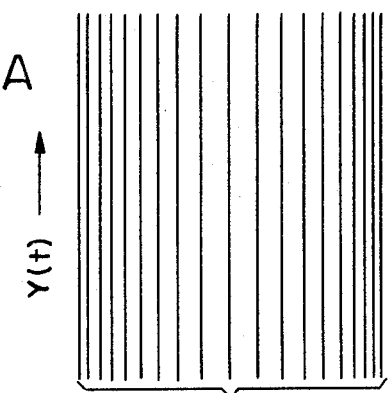
Figure 5B:
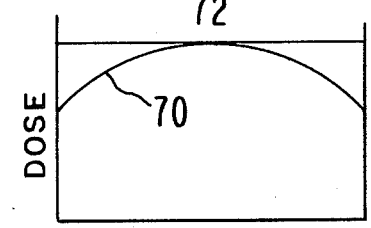

A second illustration of the method is shown in FIG. 4 wherein the time dependent modulus R(t) of each scan is of such form that the correction function is contained entirely within R(t) by varying the spacing of adjacent tracer as a function of radius which is to say a function of time. That is, the scan may be controlled in accord with a function $r = k\theta^m$ to yield the identical result. The angular frequency $\omega$ may be maintained constant or modulated to yield the desired distribution in conjunction with an appropriate spatial frequency function h(r). Therefore over the interval of the scan $0 < r < r_{max}$ a distribution of corrected form will be obtained after a sufficient number of repetitions for averaging and smoothing. One will readily recognize that frequency modulation of 107 can be combined with nonuniform spacing to yield the same result.

Any scanning pattern is appropriate for the purposes discussed. In the examples based on circular symmetry set out above, frequency modulation of the rotational frequency $\omega$ was suggested to obtain a constant dose per unit length for the trace. Trace homogeneity is not essential as a prerequisite to the practice of the present invention because the pattern scan can be arranged to compensate trace inhomogeneity. In the above example a constant angular frequency and constant radial spacing (density of traces) would lead to quadratic decline in dose (per unit length of trace) as a function of radius. Utilizing the practice of differential pattern scanning, this is compensable to achieve whatever distribution is desired by manipulating the density of traces through the spatial modulation h(r) (e.g., executing the spiral $r = k\theta^m$ as in FIG. 4B, by frequency modulation of one or more scan parameters or by controlling the number of retraces so that n(r) is proportional to $r^2$. Combinations of the three general approaches may also be invoked to obtain the desired trace density distribution.

Returning now to parallel scan systems, it is apparent that the spatial frequency and number of repetitions forming a density of traces function has general application to tailoring a dose distribution to a desired form. A desired resulting dose distribution function may be synthesized from a dose distribution taken along the trace dQ/ds and a density of traces function $\rho(x,y)$.

In a simple example, the uncorrected dose distribution 70 may result from geometrical properties of the scanning system or the workpiece. The distribution 70 may in fact be an attribute of dQ/ds resulting from a particular scanning system. The raster scan lines 72 are spatially distributed by frequency modulating the y deflection for a given x deflection function. Repetition of the scan with offsets imposed on the initial conditions for each raster frame will produce a distribution of trace density to realize the desired distribution.

One will readily observe that any desired form of dose distribution may be accomplished by the above described methods. Although the above discussion has most often referred to obtaining uniform dose distribution over the surface of a planar workpiece, the invention is clearly not so circumscribed. Large semiconductor devices of the order of dimensions of the entire workpiece may require predetermined non-uniform dose distributions especially to compensate electrical properties in the neighborhood of the periphery of the device or to facilitate later processing steps. Tailoring of distributed sheet resistivity which is a function of position on the workpiece is an example of an application where quite non-uniform, but precisely controlled, dose is required. It is also apparent that accomplishing a desired dosage over a nonplanar surface is facilitated with the present invention wherein the integrated dose is controlled by appropriate function either synthesized from a trace distribution in conjunction with a density of traces function or by straightforward tailored summing of a differentially scanned pattern. This aspect of the invention especially pertains to metallurgical processing of non-planar members such as bearings. Accordingly, other modifications and alternative methods can be employed within the present invention which is limited only by the scope of the appended claims.

What is claimed is:

1. A method for irradiating a workpiece with a flux of charged particles to obtain a desired spatial distribution of integrated radiation dose thereon, comprising
   (a) scanning the surface of the workpiece with said charged particle beam to irradiate said surface along locii of a first pattern in order to obtain a first integrated dose distribution over said surface,
   (b) scanning selected regions of said surface wherein the integrated dose distribution established by step (a) is less than said desired spatial distribution than said regions, and
   (c) repeating step (b) until said desired distribution is accomplished.

2. The method of claim 1 wherein said desired distribution is uniform over said surface.

3. The method of claim 1 wherein said surface is planar.

4. A method for irradiating a workpiece with a flux of charged particles to obtain a desired spatial distribution of integrated radiation dose in accord with a function of generalized coordinates p and q on the surface of said workpiece, comprising
   (a) scanning to define irradiated path segments mutually spaced apart over a surface portion of said workpiece and forming a first pattern thereon,
   (b) modulating said scanning to control said spacing of said path segments in accord with a desired functional dependence.

5. The method of claim 4 wherein said scanning step comprises
   directing said flux along a first coordinate p in accord with a periodic waveform.

6. The method of claim 5 wherein said modulating step comprises
   modulating the period of said waveform in accord with the value of said coordinate q.

7. The method of distributing a radiation dose over a surface, comprising
   scanning a radiation flux over a path s on said surface with a radiation distribution function dq(s) along a path s on said surface,
   distributing paths s over said surface in accord with a density of traces weighting function $\rho(p,q)$ where p and q are generalized coordinates on said surface and said function $\rho(p,q)$ measures the numbers of traces M in an area increment $dA = dp \cdot dq$ at respective coordinates p and q.

8. The method of claim 7 wherein said surface is non-planar and said weighted density of traces is selected to yield a desired dose distribution to said non-planar surface.

9. Apparatus for irradiating an object with a radiation flux to distribute the radiation dose over the surface of said object in accord with a desired areal distribution dQ (p,q) comprising
   (a) radiation source means,
   (b) scanning means for directing said radiation flux in spaced-apart trace portions over a portion of the surface of said object,
   (c) trace distributing means for controlling the number of traces per unit area as a function of said generalized surface coordinates p and q.

10. The apparatus of claim 9 wherein said trace distributing means comprises
    means for repeating said portions of traces a desired number of times in a given region of said surface in accord with a relationship to the coordinates $p_r$, $q_r$ locating said region.

11. The apparatus of claim 9 wherein said scanning means comprises
    deflection means for directing said flux in accord with a desired periodic waveform, and
    said distributing means comprises frequency modulation means for altering the period of said waveform.

12. The apparatus of claim 9 wherein said scanning means comprises
    deflection means for directing said flux in accord with a desired periodic waveform, and
    said trace distribution means comprises means for controlling the spatial separation of adjacent said trace portions in said time sequence as a function of said coordinates p and q.

* * * * *